(12) United States Patent
Czamara et al.

(10) Patent No.: US 9,894,808 B2
(45) Date of Patent: Feb. 13, 2018

(54) COMPRESSED AIR COOLING SYSTEM FOR DATA CENTER

(75) Inventors: Michael P. Czamara, Seattle, WA (US); Osvaldo P. Morales, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 1521 days.

(21) Appl. No.: 12/751,209

(22) Filed: Mar. 31, 2010

(65) Prior Publication Data

US 2011/0239683 A1 Oct. 6, 2011

(51) Int. Cl.
F25D 23/12 (2006.01)
F25D 9/00 (2006.01)
F25B 1/00 (2006.01)
H05K 7/20 (2006.01)

(52) U.S. Cl.
CPC .................. H05K 7/20745 (2013.01)

(58) Field of Classification Search
CPC .......... H05K 7/20145; H05K 7/20554; H05K 7/2059; H05K 7/20745; F24F 5/0085
USPC ........ 62/259.2, 259.4, 401, 501; 165/104.33, 165/54
See application file for complete search history.

(56) References Cited

U.S. PATENT DOCUMENTS

| | | |
|---|---|---|
| 3,481,485 A | 12/1969 | Hess |
| 3,807,572 A | 4/1974 | Luvara et al. |
| 3,834,423 A | 9/1974 | Elson |
| 3,915,477 A | 10/1975 | Timmons |
| 4,082,092 A | 4/1978 | Foster |
| 4,328,897 A | 5/1982 | Weiss |
| 4,448,111 A | 5/1984 | Doherty |
| 4,585,122 A | 4/1986 | Stegenga |
| 4,864,469 A | 9/1989 | Boudon |
| 4,926,291 A | 5/1990 | Sarraf |
| 5,208,722 A | 5/1993 | Ryan et al. |
| 5,294,049 A | 3/1994 | Trunkle et al. |
| 5,412,534 A | 5/1995 | Cutts et al. |
| 5,473,507 A | 12/1995 | Schwegler et al. |
| 5,506,750 A | 4/1996 | Carteau et al. |
| 5,518,277 A | 5/1996 | Sanders |
| 5,621,890 A | 4/1997 | Notarianni et al. |
| 5,644,472 A | 7/1997 | Klein |
| 5,682,289 A | 10/1997 | Schwegler et al. |

(Continued)

FOREIGN PATENT DOCUMENTS

| | | |
|---|---|---|
| EP | 0 546 211 | 6/1993 |
| EP | 0 741 269 | 11/1996 |

(Continued)

OTHER PUBLICATIONS

U.S. Appl. No. 11/535,180.

(Continued)

*Primary Examiner* — Joseph Trpisovsky
(74) *Attorney, Agent, or Firm* — Robert C. Kowert; Meyertons, Hood, Kivlin, Kowert & Goetzel, P.C.

(57) ABSTRACT

A system for removing heat from components in a computer room of data center includes one or more air storage containers that hold compressed air, one or more compressors that supply compressed air to the air storage containers, and one or more plenums in fluid communication with at least one of the storage containers. At least one of the plenums can supply air to a computer room.

27 Claims, 7 Drawing Sheets

(56) References Cited

U.S. PATENT DOCUMENTS

| | | |
|---|---|---|
| 5,751,549 A | 5/1998 | Eberhardt et al. |
| 5,772,500 A | 6/1998 | Harvey et al. |
| 5,796,580 A | 8/1998 | Komatsu et al. |
| 5,806,438 A | 9/1998 | Beaudet |
| 5,822,184 A | 10/1998 | Rabinovitz |
| 5,843,131 A | 12/1998 | McDonough |
| 5,871,396 A | 2/1999 | Shen |
| 6,031,717 A | 2/2000 | Baddour et al. |
| 6,039,190 A | 3/2000 | Clausen |
| 6,141,986 A | 11/2000 | Koplin |
| 6,166,917 A | 12/2000 | Anderson |
| 6,259,605 B1 | 7/2001 | Schmitt |
| 6,364,009 B1 | 4/2002 | Macmanus et al. |
| 6,425,417 B1 | 7/2002 | Paschke |
| 6,456,498 B1 | 9/2002 | Larson et al. |
| 6,459,579 B1 | 10/2002 | Farmer et al. |
| 6,469,899 B2 | 10/2002 | Hastings et al. |
| 6,496,366 B1 | 12/2002 | Coglitore et al. |
| 6,499,609 B2 | 12/2002 | Patriche et al. |
| 6,525,936 B2 | 2/2003 | Beitelmal et al. |
| 6,563,704 B2 | 5/2003 | Grouell et al. |
| 6,590,768 B1 | 7/2003 | Wiley |
| 6,603,661 B2 | 8/2003 | Smith et al. |
| 6,621,693 B1 | 9/2003 | Potter et al. |
| 6,625,020 B1 | 9/2003 | Hanson et al. |
| 6,650,535 B1 | 11/2003 | Moss et al. |
| 6,754,082 B1 | 6/2004 | Ding et al. |
| 6,767,280 B1 | 7/2004 | Berger |
| 6,791,836 B2 | 9/2004 | Cipolla et al. |
| 6,795,314 B1 | 9/2004 | Arbogast et al. |
| 6,804,123 B1 | 10/2004 | Cheng |
| 6,819,567 B2 | 11/2004 | Baker et al. |
| 6,833,995 B1 | 12/2004 | Hsue et al. |
| 6,859,366 B2 | 2/2005 | Fink et al. |
| 6,960,130 B2 | 11/2005 | Gebke et al. |
| 7,003,966 B2 | 2/2006 | Sharma et al. |
| 7,010,392 B2 | 3/2006 | Bash et al. |
| 7,031,154 B2 | 4/2006 | Bash et al. |
| 7,035,111 B1 | 4/2006 | Lin et al. |
| 7,042,722 B2 | 5/2006 | Suzuki et al. |
| 7,068,505 B2 | 6/2006 | Kosugi |
| 7,112,131 B2 | 9/2006 | Rasmussen et al. |
| 7,197,433 B2 | 3/2007 | Patel et al. |
| 7,238,104 B1 | 7/2007 | Greenslade et al. |
| 7,257,956 B2 | 8/2007 | Shimada et al. |
| 7,272,001 B2 | 9/2007 | Cheng |
| 7,278,273 B1 | 10/2007 | Whitted et al. |
| 7,283,358 B2 | 10/2007 | Campbell et al. |
| 7,346,913 B2 | 3/2008 | Ishimine et al. |
| 7,361,081 B2 | 4/2008 | Beitelmal et al. |
| 7,379,299 B2 | 5/2008 | Walsh et al. |
| 7,403,385 B2 | 7/2008 | Boone et al. |
| 7,408,775 B2 | 8/2008 | Walz et al. |
| 7,434,413 B2 * | 10/2008 | Wruck ............................ 62/126 |
| 7,486,505 B2 | 2/2009 | Fushimi et al. |
| 7,499,286 B2 | 3/2009 | Berke et al. |
| 7,500,911 B2 | 3/2009 | Johnson et al. |
| 7,542,288 B2 | 6/2009 | Lanus |
| 7,660,116 B2 | 2/2010 | Claassen et al. |
| 7,660,117 B2 | 2/2010 | Werner et al. |
| 7,701,710 B2 | 4/2010 | Tanaka et al. |
| 7,733,666 B2 | 6/2010 | Ichihara et al. |
| 7,746,634 B2 | 6/2010 | Hom et al. |
| 7,764,498 B2 | 7/2010 | Conn |
| 7,768,780 B2 | 8/2010 | Coglitore et al. |
| 7,768,787 B2 | 8/2010 | Vaughan et al. |
| 7,804,685 B2 | 9/2010 | Krietzman |
| 7,821,790 B2 | 10/2010 | Sharma et al. |
| 7,843,685 B2 | 11/2010 | Beauchamp et al. |
| 7,869,210 B2 | 1/2011 | Moss |
| 7,878,888 B2 | 2/2011 | Rasmussen et al. |
| 7,929,300 B1 | 4/2011 | Bisbikis et al. |
| 7,944,700 B2 | 5/2011 | Wang et al. |
| 7,990,700 B2 | 8/2011 | Guo |
| 8,087,979 B2 | 1/2012 | Rasmussen |
| 8,154,870 B1 | 4/2012 | Czamara et al. |
| 2001/0029163 A1 | 10/2001 | Spinazzola et al. |
| 2002/0021557 A1 * | 2/2002 | Ishimine et al. ............ 361/720 |
| 2002/0100736 A1 | 8/2002 | Lopez |
| 2002/0134531 A1 | 9/2002 | Yanagida |
| 2002/0181194 A1 | 12/2002 | Ho et al. |
| 2003/0156385 A1 | 8/2003 | Askeland et al. |
| 2004/0020224 A1 | 2/2004 | Bash et al. |
| 2004/0032722 A1 | 2/2004 | Wrycraft et al. |
| 2004/0165349 A1 | 8/2004 | Arbogast et al. |
| 2004/0218355 A1 | 11/2004 | Bash et al. |
| 2005/0135069 A1 | 6/2005 | King et al. |
| 2005/0166860 A1 | 8/2005 | Austin et al. |
| 2005/0188689 A1 * | 9/2005 | Juby et al. ................... 60/413 |
| 2005/0228618 A1 | 10/2005 | Patel et al. |
| 2005/0237716 A1 | 10/2005 | Chu et al. |
| 2005/0257232 A1 | 11/2005 | Hidaka |
| 2005/0265004 A1 | 12/2005 | Coglitore et al. |
| 2005/0281014 A1 | 12/2005 | Carullo et al. |
| 2006/0059037 A1 * | 3/2006 | Perkins et al. .............. 62/259.2 |
| 2006/0061955 A1 | 3/2006 | Imblum |
| 2006/0123804 A1 * | 6/2006 | Widegren ........................ 62/97 |
| 2006/0250766 A1 | 11/2006 | Blaalid et al. |
| 2006/0274496 A1 | 12/2006 | Lee et al. |
| 2006/0290245 A1 | 12/2006 | Hidaka |
| 2007/0053169 A1 | 3/2007 | Carlson et al. |
| 2007/0074525 A1 * | 4/2007 | Vinson et al. ............... 62/259.2 |
| 2007/0076369 A1 | 4/2007 | Chen et al. |
| 2007/0101746 A1 | 5/2007 | Scholm et al. |
| 2007/0159790 A1 | 7/2007 | Coglitore et al. |
| 2007/0213000 A1 | 9/2007 | Day |
| 2007/0217172 A1 | 9/2007 | Bisbikis et al. |
| 2007/0223200 A1 | 9/2007 | Fujiya et al. |
| 2007/0240433 A1 * | 10/2007 | Manole ............................ 62/91 |
| 2008/0013275 A1 | 1/2008 | Beckley et al. |
| 2008/0029250 A1 | 2/2008 | Carlson et al. |
| 2008/0037209 A1 | 2/2008 | Niazi et al. |
| 2008/0043427 A1 | 2/2008 | Lee et al. |
| 2008/0055846 A1 | 3/2008 | Clidaras et al. |
| 2008/0094797 A1 | 4/2008 | Coglitore et al. |
| 2008/0112127 A1 | 5/2008 | June et al. |
| 2008/0158813 A1 | 7/2008 | Yin |
| 2008/0191590 A1 | 8/2008 | Lin et al. |
| 2008/0232064 A1 * | 9/2008 | Sato et al. ................... 361/687 |
| 2008/0259566 A1 | 10/2008 | Fried |
| 2008/0285232 A1 | 11/2008 | Claassen et al. |
| 2008/0305733 A1 * | 12/2008 | Noteboom et al. ........... 454/184 |
| 2009/0061755 A1 | 3/2009 | Calder et al. |
| 2009/0086441 A1 | 4/2009 | Randall et al. |
| 2009/0097200 A1 | 4/2009 | Sharma et al. |
| 2009/0109609 A1 | 4/2009 | Lai et al. |
| 2009/0122505 A1 | 5/2009 | Lu |
| 2009/0237877 A1 | 9/2009 | Honda et al. |
| 2009/0257187 A1 | 10/2009 | Mills et al. |
| 2009/0260384 A1 | 10/2009 | Champion et al. |
| 2009/0296322 A1 | 12/2009 | Yang et al. |
| 2009/0321105 A1 | 12/2009 | Sawyer |
| 2010/0024445 A1 * | 2/2010 | Cichanowicz .................... 62/86 |
| 2010/0091458 A1 | 4/2010 | Mosier et al. |
| 2010/0149754 A1 | 6/2010 | Chapel et al. |
| 2010/0271766 A1 | 10/2010 | Lin |
| 2011/0149508 A1 | 6/2011 | Malekmadani |
| 2011/0284422 A1 | 11/2011 | Yamada |

FOREIGN PATENT DOCUMENTS

| | | |
|---|---|---|
| EP | 0741269 | 11/1996 |
| EP | 2 053 911 | 4/2009 |
| EP | 2053911 | 4/2009 |
| EP | 2202751 | 6/2010 |
| JP | 2009192168 | 8/2009 |
| JP | 2010-86450 | 4/2010 |
| WO | 98/34450 | 8/1998 |
| WO | 9834450 | 8/1998 |
| WO | 2006028846 | 3/2006 |

(56) References Cited

FOREIGN PATENT DOCUMENTS

| WO | 2008/143503 | 11/2008 |
| WO | 2008143503 | 11/2008 |

OTHER PUBLICATIONS

U.S. Appl. No. 12/341,137, filed Dec. 28, 2008.
U.S. Appl. No. 11/956,849, filed Dec. 14, 2007.
U.S. Appl. No. 12/163,146, filed Jun. 27, 2008.
U.S. Appl. No. 12/646,417, filed Dec. 23, 2009.
U.S. Appl. No. 12/751,212, filed Mar. 31, 2010.
International Search Report from PCT/US2011/028002, dated Jun. 21, 2011, Amazon Technologies, Inc., 11 pages.
Japanese Office Action for Patent Application Number, 2012-557264, dated Oct. 8, 2013, Yamakawa, pp. 1-3.
U.S. Appl. No. 11/535,180, filed Sep. 26, 2006, Osvaldo P. Morales.
U.S. Appl. No. 12/751,209, filed Mar. 31, 2010, Michael P. Czamara.
U.S. Appl. No. 12/163,146, filed Jun. 27, 2008, Osvaldo P. Morales.
U.S. Appl. No. 12/886,437, filed Sep. 20, 2010, Peter G. Ross.
U.S. Appl. No. 12/886,472, filed Sep. 20, 2010, Peter G. Ross.
U.S. Appl. No. 12/886,469, filed Sep. 20, 2010, Peter G. Ross.
U.S. Appl. No. 11/956,849, filed Dec. 14, 2007, Osvaldo P. Morales.
U.S. Appl. No. 12/646,417, filed Dec. 23, 2009, Michael P. Czamara.
U.S. Appl. No. 12/341,137, filed Dec. 28, 2008, Jonathan David Hay.
U.S. Appl. No. 12/751,212, filed Mar. 31, 2010, Michael P. Czamara.
U.S. Appl. No. 12/886,440, filed Sep. 20, 2010, Peter GRoss et al.
U.S. Appl. No. 13/103,860, filed May 9, 2011, Michael P. Czamara.
U.S. Appl. No. 12/751,206, filed Mar. 31, 2010, Michael W. Schrempp.
U.S. Appl. No. 12/893,813, filed Sep. 29, 2010, Richard C. Towner.
Office Action from Japanese Application No. 2012357264, dated Jun. 27, 2014, English version, pp. 1-9.

\* cited by examiner

COMPRESSED AIR COOLING SYSTEM FOR DATA CENTER

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carried out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a racking system. Some known racking systems include 40 such rack-mounted components and such racking systems will therefore generate as much as 10 kilowatts of waste heat. Moreover, some known data centers include a plurality of such racking systems. Some known data centers include methods and apparatus that facilitate waste heat removal from a plurality of racking systems, typically by circulating air through one or more of the rack systems. The air handling and cooling equipment often used to cool a data center may include various combinations of HVAC systems, chilled water systems, evaporative cooling systems, and related components such cooling towers, blowers, refrigerant loops, and variable frequency drives. Such air handling and cooling equipment adds substantial cost and complexity to the data center. Moreover, in some cases, such equipment may create acoustic noise that exceeds acceptable limits for an environment, such as noise limits imposed under municipal noise control ordinances.

The amount of computing capacity needed for any given data center may change rapidly as business needs dictate. Most often, there is a need for increased computing capacity at a location. Initially providing computing capacity in a data center, or expanding the existing capacity of a data center (in the form of additional servers, for example), is resource-intensive and may take many months to effect. Substantial time and resources are typically required to design and build a data center (or expansion thereof), lay cables, install racks and cooling systems. Additional time and resources are typically needed to conduct inspections and obtain certifications and approvals, such as for electrical and HVAC systems.

Figure 1:
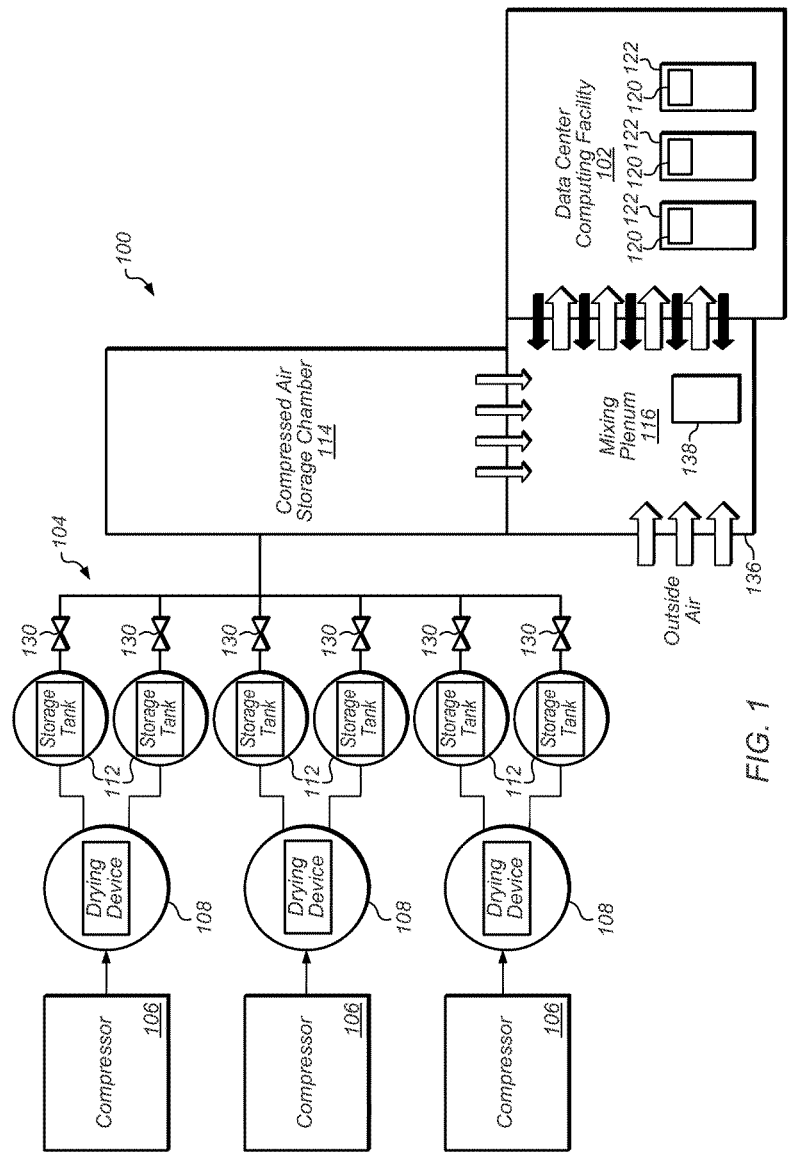
FIG. 1 is a schematic diagram illustrating a cooling system for a data center using compressed air according to one embodiment.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of systems and method using compressed air for cooling computer systems in a data center are disclosed. According to one embodiment, a system for removing heat from components in a computer room of data center includes one or more air storage containers that hold compressed air, one or more compressors that supply compressed air to the air storage containers, and one or more plenums in fluid communication with at least one of the air storage containers. At least one of the plenums can supply air to a computer room.

According to one embodiment, a data center includes a computer room one or more computer systems in the computer room and a cooling system that cools heat producing components in the computer systems. The cooling air system includes one or more air storage containers that hold compressed air, one or more compressors that supply compressed air to the air storage containers, and one or more plenums in fluid communication with at least one of the storage containers. At least one of the plenums supplies air to the computer room. In certain embodiments, a compressed air cooling system may be used at a data center in lieu of any chilled water systems or refrigerant loops.

According to one embodiment, a method of cooling computer systems in computer room of a data center includes compressing air and storing the compressed air in one or more containers. A portion of the air from the container may be introduced into the computer room. A portion of the air in the computer room may be passed over heat producing components of one or more computer systems in the computer room to cool the heat producing components.

As used herein, an "aisle" means a space next to one or more racks.

As used herein, "ambient" means, with respect to a system or facility, the air surrounding at least a portion of the system or facility. For example, with respect to a data center, ambient air may be air outside the data center, for example, at or near an intake hood of an air handling system for the data center.

As used herein, "computing" includes any operations that can be performed by a computer, such as computation, data storage, data retrieval, or communications.

As used herein, a "damper" includes any device or component that can be moved to control (e.g., increase or decrease) the flow of fluid through a duct or other passageway. Examples of dampers include plates, blades, panels, or discs, or any combination thereof. A damper may include multiple elements. For example, a damper may include a series of plates in parallel relation to one another that can be simultaneously rotated to close a duct. As used herein, to "position" a damper means to place or leave one or more elements of the damper to achieve desired flow characteristics through the damper, such as open, closed, or partially open.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "chamber" means an at least partially enclosed space. A chamber may have any shape. A chamber may have one cell or more than one cell.

As used herein, "compressed air" means air that has been compressed to a pressure that exceeds ambient pressure.

As used herein, "compressor" any device that can be used to compress air. Examples of suitable compressor types may include positive displacement, dynamic, reciprocating, axial, centrifugal, rotary screw, sliding vane, or diaphragm.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, a "container" may be any of various shapes and sizes. Suitable containers may include tanks, cylinders, vessels, and tubes. A container may form a single internal volume (such as a single tank) or more than one internal volume (such as multiple tanks).

As used herein, "drying device" means any device that can remove moisture from air. In some embodiments, a drying device includes a desiccant. The desiccant may be in various forms, including a bed, block, or embedded in a filter. In some embodiments, a drying device may include a drip tray.

As used herein, "data center module" means a module that includes, or is suitable for housing and/or physically supporting, one or more computer systems that can provide computing resources for a data center.

As used herein, "evaporative cooling" means cooling of air by evaporation of liquid.

As used herein, elements are "in fluid communication" if fluid can flow between the elements during at least one operating condition. Fluid communication may be controlled. For example, a valve may be provided between two elements in fluid communication with one another. In some embodiments, intermediate elements may be provided between elements in fluid communication with one another. A plenum may be provided between an air compressor and a data room that are in fluid communication with on another.

As used herein, a "free cooling" includes operation in which an air handling system pulls air at least partially from an external source (such as air outside a facility) and/or a return from a computer room, and forces the air to electronic equipment without active chilling in the air-handling subsystem.

As used herein, "mechanical cooling" means cooling of air by a process that involves doing mechanical work on at least one fluid, such as occurs in vapor-compression refrigeration systems.

As used herein, a "module" is a component or a combination of components physically coupled to one another. A module may include functional elements and systems, such as computer systems, racks, blowers, ducts, power distribution units, fire suppression systems, and control systems, as well as structural elements, such a frame, housing, or container. In some embodiments, a module is pre-fabricated at a location off-site from a data center.

As used herein, "plenum" means a chamber that can be used to distribute air.

As used herein, a "rack" means rack, container, frame, or other element or combination of elements that can contain or physically support one or more computer systems.

As used herein, "room" means a room or a space of a building. As used herein, "computer room" means a room of a building in which computer systems, such as rack-mounted servers, are operated.

As used herein, a "space" means a space, area or volume.

FIG. 1 is a schematic diagram illustrating a cooling system for a data center including compressed air storage according to one embodiment. Data center 100 includes data center computing facility 102 and cooling system 104. Cooling system 104 includes compressors 106, drying devices 108, compressed air storage tanks 112, compressed air storage chamber 114, and mixing plenum 116. Data center computing facility 102 includes computer systems 120 in racks 122.

Compressors 106 draw in ambient air and compress the air. The compressed air is passed through drying devices 108. Drying devices 108 may remove and/or collect water from compressed air. In some embodiments, one or of the drying devices may be desiccating devices. A drying device may include, for example, a desiccant material, such as silica. In certain embodiments, drying devices may be located in compressed air storage tanks 112 in lieu of, or in addition to, drying devices between compressors 106 and compressed air storage tanks 112. For example, one or more of compressed air storage tanks 112 may include a drip tray.

Water accumulated in a drying device, such a drip tray, may be periodically bled off to purge the water from cooling system 104.

In some embodiments, drying devices may incorporate, or be placed in series with, one or more filters. The filters may remove impurities from the compressed air. For example, filters may remove any lubricants, such as oil, that leaked into compressed air in compressors 106 during the compression process. Filters may also remove impurities that were present in the source air that was drawn into the compressors. For example, filters may remove contaminants that were introduced with the outside air drawn into the compressors, such as smoke, smog, and airborne by-products of industrial and/or agricultural activities.

Compressed air from compressors 106 may be accumulated in compressed air storage tanks 112. Valves 130 allow for control of air out of compressed air storage tanks 112. Valves 130 may be controlled manually, automatically, or a combination thereof. In some embodiments, control system 134 is used to control valves 130.

In the embodiment shown in FIG. 1, cooling system 104 includes three compressors 106 and six compressed air storage tanks 112. A cooling system may, however, include any number of compressors, storage tanks, drying devices, and other elements. In addition, the order and arrangement of the elements may vary in other embodiments. In one embodiment, a cooling system includes only a single compressor and only a single storage tank.

During operation of cooling system 104, compressed air may be released from one or more of compressed air storage tanks 112 and released into compressed air storage chamber 114. Air from compressed air storage tanks 112 may cool as the air is expanded in compressed air storage chamber 114. Air from compressed air storage chamber 114 may be introduced into mixing plenum 116. Air from compressed may further cool as the air is expanded into mixing plenum 116. Outside air may also be introduced into mixing plenum 116 through outside air vent 136. Compressed air and outside air may be mixed in mixing plenum 116. The air from compressed air storage tanks 112 may be dry because moisture was removed during compression. Humidification device 138 may add moisture to air in mixing plenum 116. Air from mixing plenum 116 may be supplied to computer room 102 to cool computer systems 120 in racks 122. In some embodiments, all or a portion of the air may be returned to mixing plenum 116.

Figure 2:
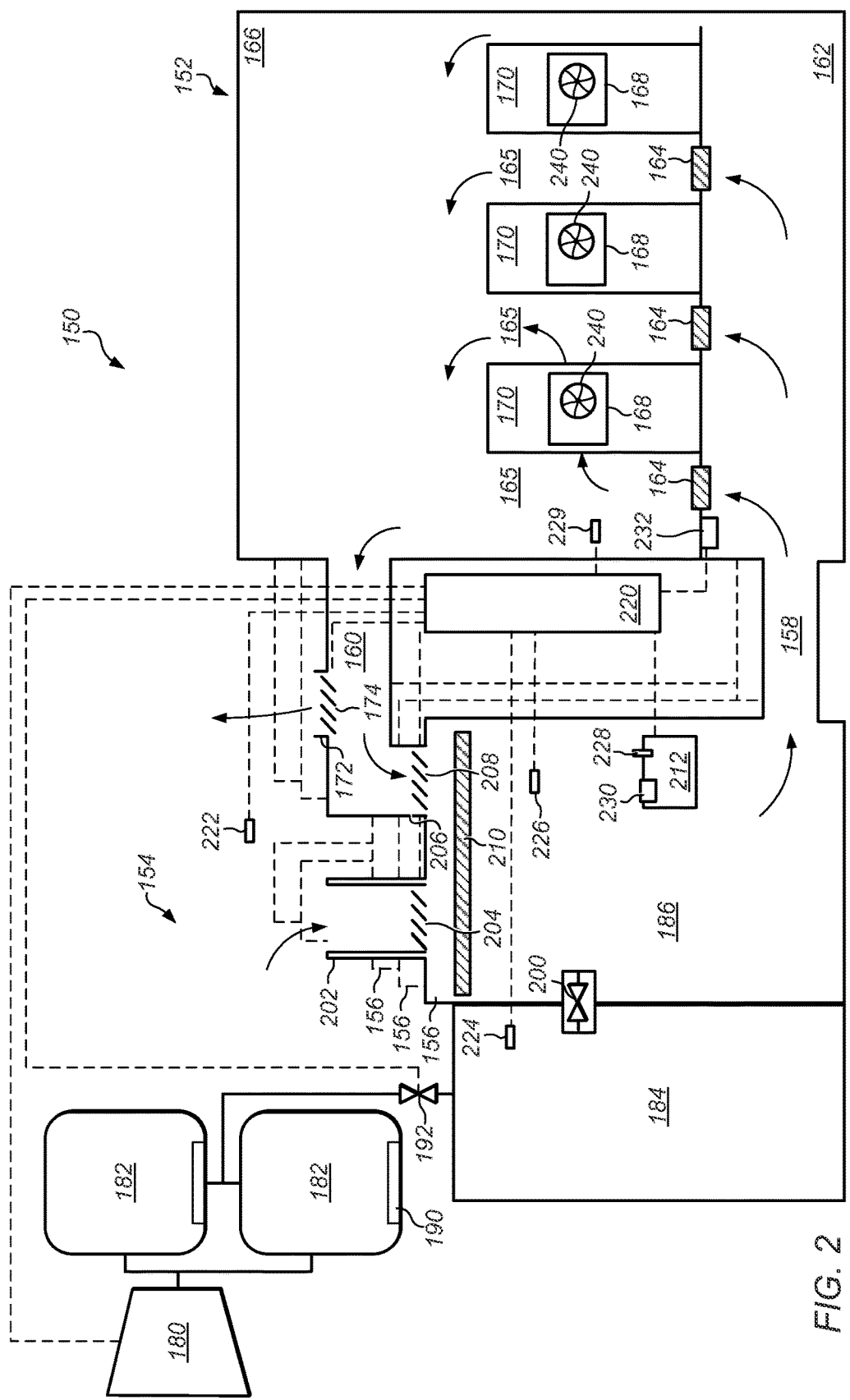
FIG. 2 is a schematic diagram illustrating one embodiment of a data center including a sub-floor supply plenum.

FIG. 2 is a schematic diagram illustrating one embodiment of a data center including a sub-floor supply plenum. Data center 150 includes computing facility 152 and cooling system 154. Cooling system 154 may remove heat from computing facility 152. In the embodiment illustrated in FIG. 2, cooling system 154 includes compressed air sub-systems 156. Compressed air sub-systems 156 may provide cooling air to computing facility 152.

For illustrative purposes, three compressed air sub-systems 156 are shown in FIG. 2 (for clarity, details of only the front air handling sub-system 156 are shown). The number of compressed air sub-systems 156 in cooling system 154 may vary, however. In addition, the number of compressors, storage tanks, storage chambers may vary from embodiment to embodiment (and, within a given embodiment, from sub-system to sub-system). In some embodiments, cooling system 154 includes many compressed air sub-systems 156. In another embodiment, cooling system 154 includes only one compressed air sub-system 156. In facilities with multiple compressed air sub-systems and/or multiple computing facilities, cross-over ducts may be provided (e.g., on the supply side, the return side, or both) to allow cooling air from compressed air sub-systems to be distributed and/or redirected within a data center or among data centers. Compressed air sub-systems may be commonly controlled, separately controlled, or a combination thereof. In certain embodiments, only a sub-set of the total compressed air sub-systems for a data center are provided with outside air vents. For example, half the compressed air sub-systems at a data center may have both outside air vents and return air vents, while the other half the compressed air sub-systems at a data center have only return air vents.

In some embodiments, portions of a compressed air system may be in a separate location from a data center. For example, compressors and/or compressed air storage tanks may be operated and maintained at a separate location from the data center. Compressed air may be transported in tanks or piped from the separate location to the data center.

Each compressed air sub-system 156 may be coupled to data center 154 by supply duct 158 and return duct 160. Cooling air may flow from compressed air sub-system 156 through supply duct 158 into sub-floor plenum 162. From sub-floor plenum 162, cooling air may pass through flow restriction devices 164 into aisles 165 in room 166. Cooling air may into pass over into racks 170 and over computer systems 168. After the air is heated by computer systems 168 in racks 170, the air may pass through return duct 160. Air may be recirculated through one or more compressed air sub-systems or discharged from the system through exhaust vent 172. Exhaust vent 172 includes exhaust damper 174.

In some embodiments, curtains and/or ducts may be segregate relatively cool air going into racks 170 from heated air coming out of racks 170.

Compressed air sub-system 156 includes compressor 180, compressed air storage tanks 182, compressed air storage chamber 184, and mixing plenum 186. Compressor 180, compressed air storage tanks 182, and/or compressed air storage chamber 184 may be in the same building as mixing plenum 186, or in a different building.

Drying devices 190 are provided in compressed air storage tanks 182. Valve 192 is provided between compressed air storage tanks 182 and compressed air storage chamber 184. Valve 192 may be operated to control the flow of air from compressed air storage tanks 182 to compressed air storage chamber 184.

Each compressed air sub-system 156 may include compressed air release valve 200, outside air damper 204, and return air vent 206, and return air damper 208. Compressed air release valve 200, outside air damper 204, and return air damper 208 may control the flow of air into mixing plenum 186. In certain embodiments, flow of air from compressed air storage chamber 184 into mixing plenum 186 may be controlled by a damper instead of a valve.

Compressed air release valve 200, outside air damper 204, and return air damper 208 may be adjusted to control the mix of air that is being supplied to room 166. For example, on a hot day, outside air damper 204 may be closed so that all of the air for cooling computer systems in room 166 is supplied from compressed air storage chamber 184 through compressed air release valve 200 and/or air returned from room 166 through return air damper 208. In some embodiments, a mix of compressed air and recirculated air may be controlled to raise or stabilize the temperature of the air in a mixing plenum.

In certain embodiments, airflow between a compressed air storage chamber and a mixing plenum may be controlled by way of a valve in lieu of, or in addition to, a damper.

Filter 210 and humidifier 212 are provided in mixing plenum 186. Filter 210 may filter air received through outside air vent 202 and return air vent 206. Humidifier 212 may humidify air in mixing plenum 186 before the air is supplied to room 166.

Control unit 220 may be programmed to control devices in compressed air sub-systems 156. Control unit 220 is coupled to compressor 180, valve 192, humidifier 212, compressed air release valve 200, outside air damper 204, return air damper 208, and exhaust damper 174. Control unit 220 is in data communication with temperature sensors 222, 224, 226, 228, and 229, and pressure sensors 230 and 232. In one embodiment, all of compressed air sub-systems 156 are controlled with a common control unit (e.g., control unit 220). In other embodiments, separate controllers are provided for each compressed air sub-system 156, or for a subset of the compressed air sub-systems 156. Devices in compressed air sub-systems 156 may be controlled automatically, manually, or a combination thereof. Each control system may measure conditions such as temperature, pressure, flow rate, and humidity in a data center, and adjust cooling system parameters for that compressed air sub-system, such as air mixture, air sources, and flow rate based on the measured conditions.

In the embodiment shown in FIG. 2, compressed air sub-system 156 may force air through supply duct 158 into sub-floor plenum 162. In other embodiments, cooling air may be forced directly into room 166 through a supply duct without going through a sub-floor plenum. In one embodiment, a sub-floor plenum may serve as a mixing plenum for a compressed air cooling system. In various embodiments, flow restriction devices 164 may be chosen to control the flow rates and distribution of cooling air among various racks 170 in room 166. In one embodiment, a compressed air sub-system may be operated to produce a static pressure of 0.1 inches of water into the racks in a computer room.

During an accumulation mode of operation of cooling system 154, valve 192 may be fully closed. Compressor 180 may be operated to compress air. Compressed air from compressor 180 may be accumulated in compressed air storage tanks 182. Drying devices 190 may absorb and/or remove moisture from compressed air storage tanks 182.

During a cooling mode of operation of cooling system 154, valve 192 may be opened to allow compressed air to be released into compressed air storage chamber 184. As compressed air from compressed air storage tanks 182 is released into compressed air storage chamber 184, the air may expand. Compressed air from compressed air storage chamber 184 may be introduced into mixing plenum 186. As the air from compressed air storage chamber 186 enters mixing plenum 186, the air may further expand. Outside air may be introduced into mixing plenum 186 through outside air vent 202. Outside air and compressed air may mix in mixing plenum 186.

The mixture of air in mixing plenum 186 may be controlled such that the air pressure at the entrance of supply duct 158 is higher than the pressure in sub-floor plenum 162. Air from mixing plenum 186 may flow through supply duct 158 into sub-floor plenum 162. Air from sub-floor plenum 162 pass into aisles 165 in room 166, through computer systems 168 in racks 170, upwardly out of racks, and into return duct 160. In some embodiments, air is drafted through room 166, such as by natural convection. In some embodiments, fans 240 in computer systems 168 cause or promote the circulation of air between cooling system 154 and room 166 and across heat producing components in computer systems 168. In certain embodiments, however, a cooling system may not have any fans, and flow may be produced by controlling the release of compressed air into the cooling system.

In certain embodiments, a control unit includes at least one programmable logic controller. The PLC may, among other things, open and close valves or dampers in cooling air systems based upon command signals from an operator to channel air flow through a data center as necessary for the prevailing operational conditions. Alternatively, the PLC may modulate valves and dampers between fully open and fully closed positions to modulate airflow.

A control system may include temperature measurement devices that are, in one embodiment, thermocouples. Alternatively, the temperature measurement devices include, but are not limited to, resistance temperature detectors (RTDs) and any device that facilitate cooling operation as described herein. For example, a thermocouple may be positioned within mixing plenum to facilitate measuring a temperature of the air the mixing plenum.

In various embodiments, operation of one or more compressed air sub-systems of a cooling system may be controlled in response to one or more conditions. For example, the controller may be programmed to switch the air source for a compressed air sub-system from return air to outside air when one or more predetermined conditions are met, such as temperature and humidity.

Figure 3:
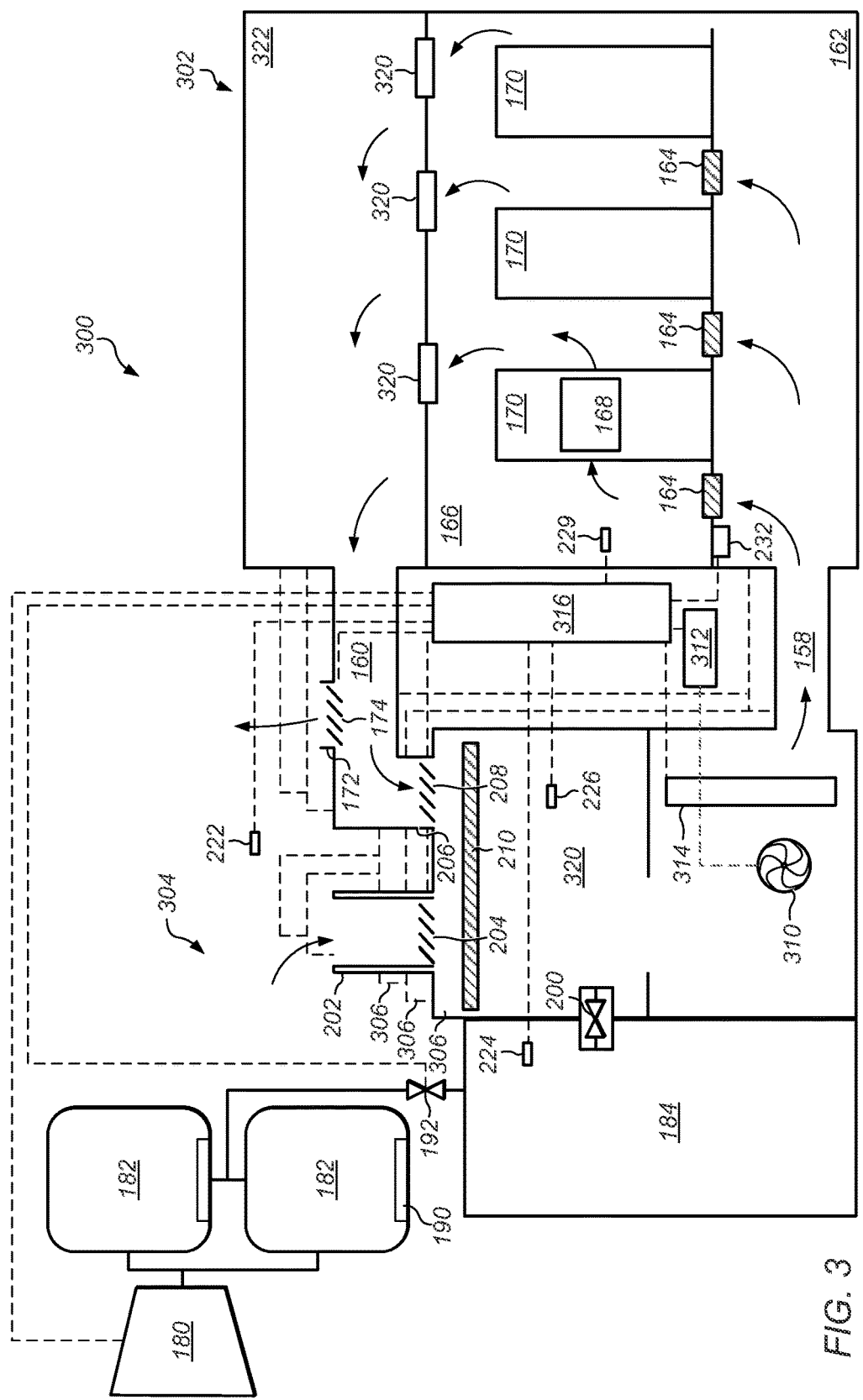
FIG. 3 is a schematic diagram illustrating one embodiment of a data center including a central fan and evaporative cooling.

FIG. 3 is a schematic diagram illustrating one embodiment of a data center including evaporative cooling. Data center 300 includes computing facility 302 and compressed air cooling system 304. Cooling system 304 includes compressed air sub-systems 306. Compressed air sub-system 306 may be similar to cooling air system 154 describe above relative to FIG. 2. Cooling system 304 also includes fan 310, variable frequency drive 312, and evaporative cooler 314. Fan 310 is coupled to variable frequency drive 312. Variable frequency drive 312 is coupled to control unit 316. VFD 214 may receive control signals from control unit 316 and subsequently modulate a rotational velocity of fan 310. Compressed air release valve 200, outside air damper 204, return air damper 208, and exhaust damper 174 may also be modulated via control unit 316 to modulate air flow through sub-system 306, in a similar manner to that discussed above relative to FIG. 2. Air may be drawn from mixing plenum 320 and through evaporative cooler 314. Evaporative cooler 314 may evaporate a liquid into air as it passes through the evaporative cooler. Air from evaporative cooler 314 may pass through supply duct 158 and into sub-floor plenum 162. Air may pass from sub-floor plenum 162 into room 166, through racks 170 to remove heat from computer systems 168 in racks 170. Heated air may flow out of racks, up through ceiling vents 320, into ceiling plenum 322, and back through return duct 160.

Figure 4:
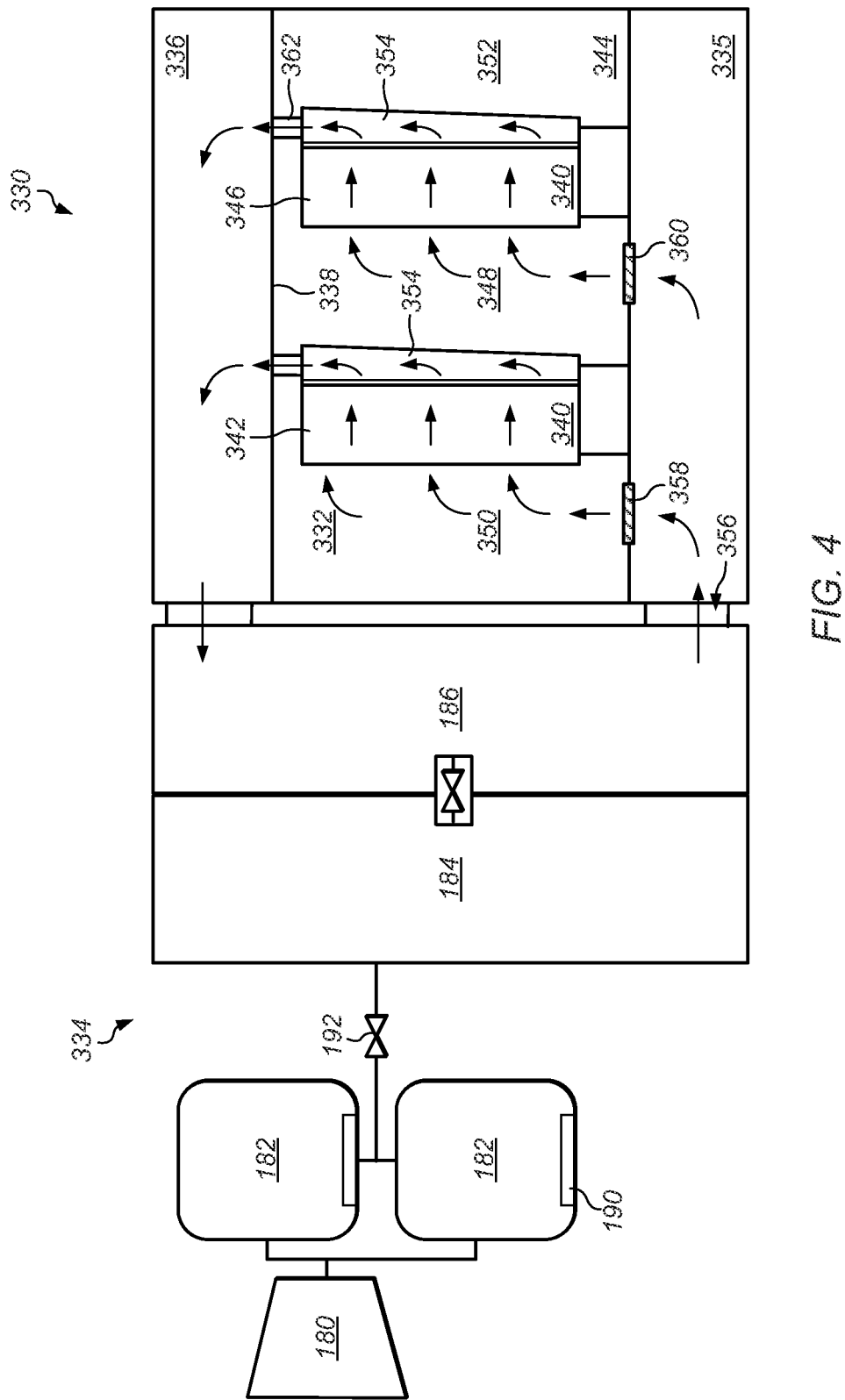
FIG. 4 is a schematic end view illustrating one embodiment of a compressed air cooling system for cooling rows of rack systems having air directing devices.

In some embodiments, a data center includes multiple rack systems with air directing devices on some or all of the rack systems. The air directing devices may segregate air entering or exiting some of the rack systems from air spaces in the data center and/or air passing through other rack systems in the data center. In some embodiments, an air directing device segregates air exiting a rack system in a row of rack systems from air in an aisle adjacent to the row. FIG. 4 illustrates a schematic end view of one embodiment of a compressed air cooling system for cooling rows of rack systems having air directing devices. Data center 330 includes computer room 332, compressed air cooling system 334, subfloor chamber 335, and plenum 336. Plenum 336 is above ceiling 338 of computer room 332.

Computer room 332 includes rack systems 340 in row 342, and rack systems 344 in row 346. Aisle 348 is formed between rows 342 and row 346. Aisles 350 and 352 are formed between the walls of computer room 332 and rows 342 and 346, respectively. Rack systems 340 and 344 include air directing devices 354.

To remove heat from servers in rack systems 340 and 344, compressed air cooling system 334 may be operated to cause air to flow in computer room 332 and through rack systems 340 and 344. Air may be forced into sub floor chamber 335 through opening 356. Air from subfloor chamber 335 may pass into computer room 332 through vents 358 and 360. Air from vent 358 may flow into aisle 350 and into rack systems 340 through the front side of row 342. Air from vent 360 may flow into aisle 348 and into rack systems 344 through the front side of row 346. Air may flow through servers in rack systems 340 and 344 and into air directing devices 354. Heated air in air directing devices 354 may be channeled through connecting ducts 362 to plenum 336. Air directing devices 354 on rack systems 340 of row 342 may segregate heated air exiting rack systems 340 from the air in aisle 348.

Figure 5B:
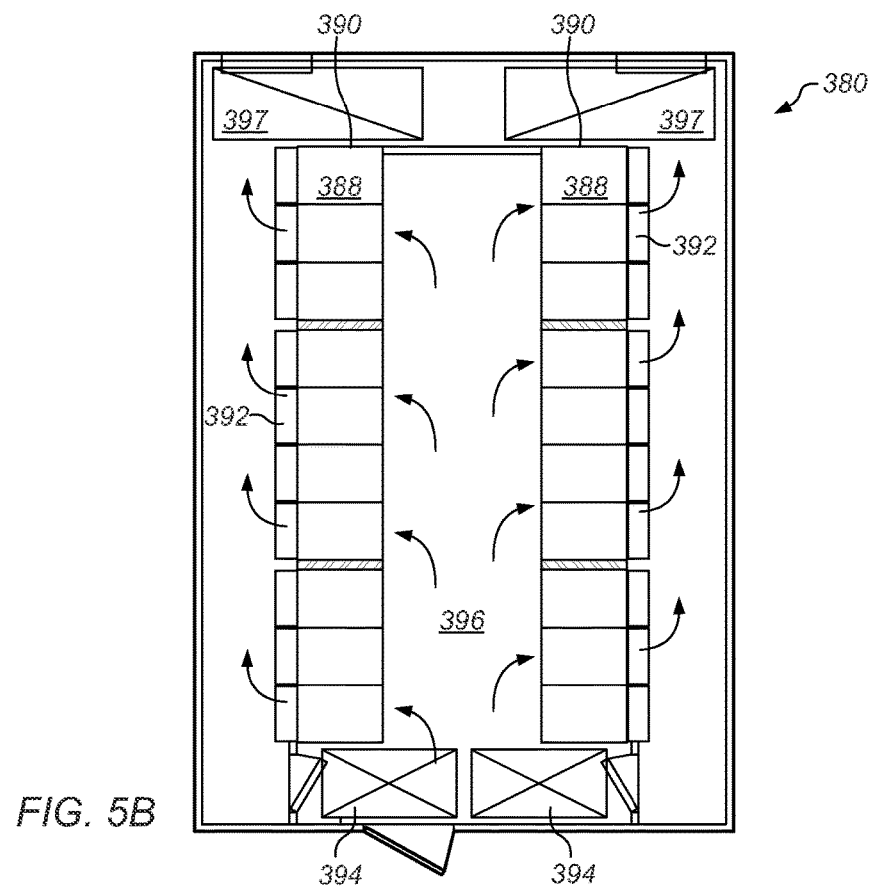
FIG. 5B illustrates a schematic top view of the computer room of a data center including rack systems with a shared aisle.
Figure 5A:
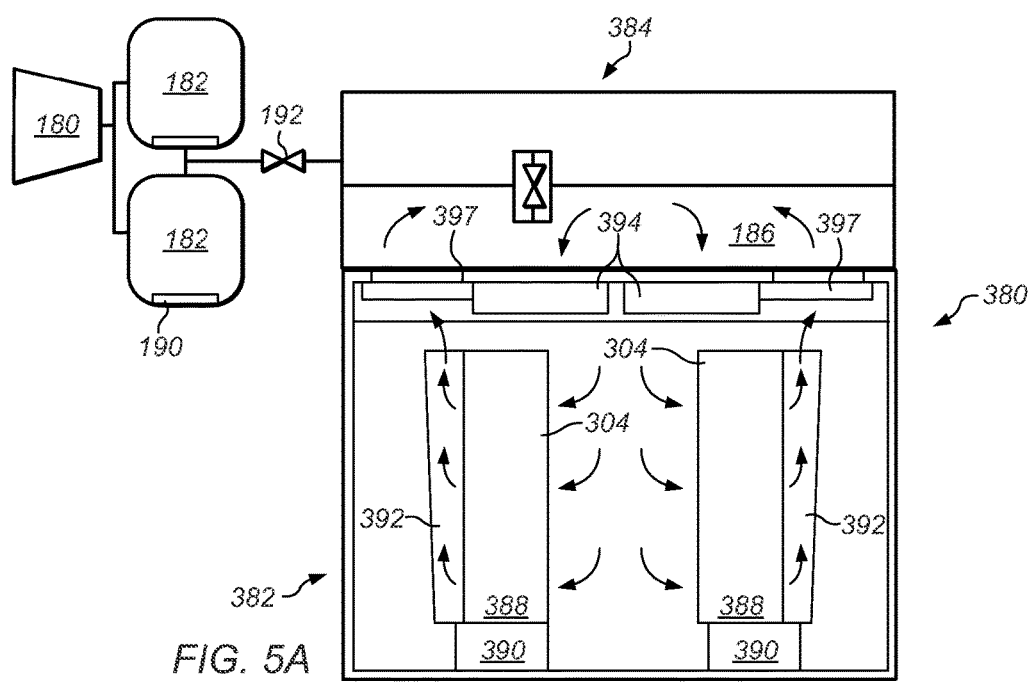
FIG. 5A illustrates a schematic end view of one embodiment of a data center including rack systems with a shared aisle.

In some embodiments of a data center, a mixing plenum for a compressed air cooling system may be exchange air through a ceiling of a computer room. FIG. 5A illustrates a schematic end view of one embodiment of a data center including rack systems with a shared aisle. FIG. 5B illustrates a schematic top view of the computer room shown in FIG. 5A. Data center 380 includes computer room 382 and compressed air cooling system 384. Compressed air cooling system 384 includes mixing plenum 386. Computer room 382 includes rack systems 388 in rows 390. In one embodiment, computer room 382 is contained in a data center module. Air directing devices 392 are coupled to rack systems 388. Compressed air cooling system 384 causes air to flow from supply vents 394 and into center aisle 396. Air from center aisle 396 flows into rack systems 388. Air directing devices 392 direct air exiting from rack systems 388 out through the tops of air directing devices 392. Return air vents 397 may draw air, including air discharged from air directing devices 392, out of computer room 382.

Figure 6:
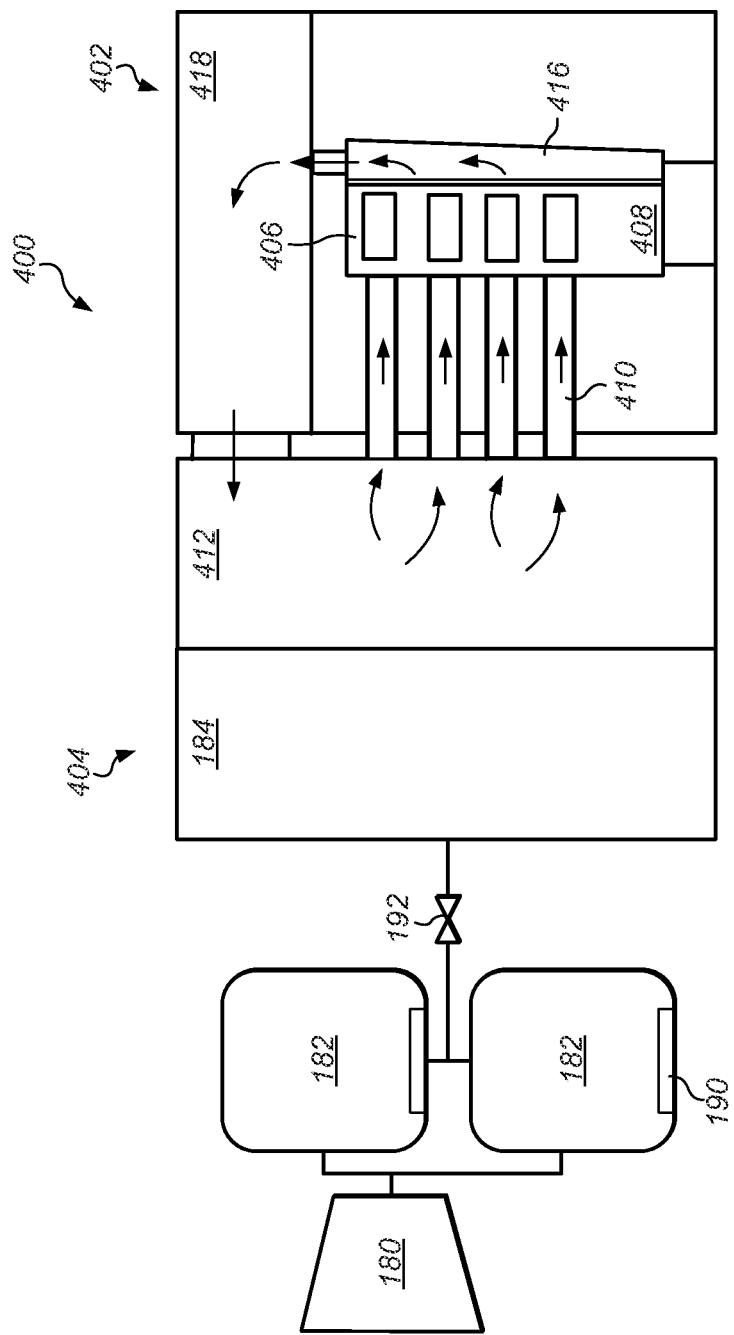
FIG. 6 illustrates an embodiment of a data center including pipes to carry air from a compressed air cooling system to a rack system.

FIG. 6 illustrates an embodiment of a data center including pipes to carry air from a compressed air cooling system to a rack system. Data center 400 includes computer room 402 and compressed air cooling system 404. Computer room 402 includes computer systems 406 in rack 408. Pipes 410 connect mixing plenum 412 with rack 414. As illustrated in FIG. 6, in one embodiment, a separate pipe 410 may be provided for each of computer system 406. During operation, air from mixing plenum 412 may flow through pipes 410 into rack 408 and across computer systems 406. Air heated by computer systems may flow into air directing device 416, to plenum 418, and return to mixing plenum 412. In certain embodiments, flow control devices may be used to control and/or tune the flow of air through the various pipes 410. In certain embodiments, pipes 410 may couple to racks using quick-disconnect devices.

Figure 7:
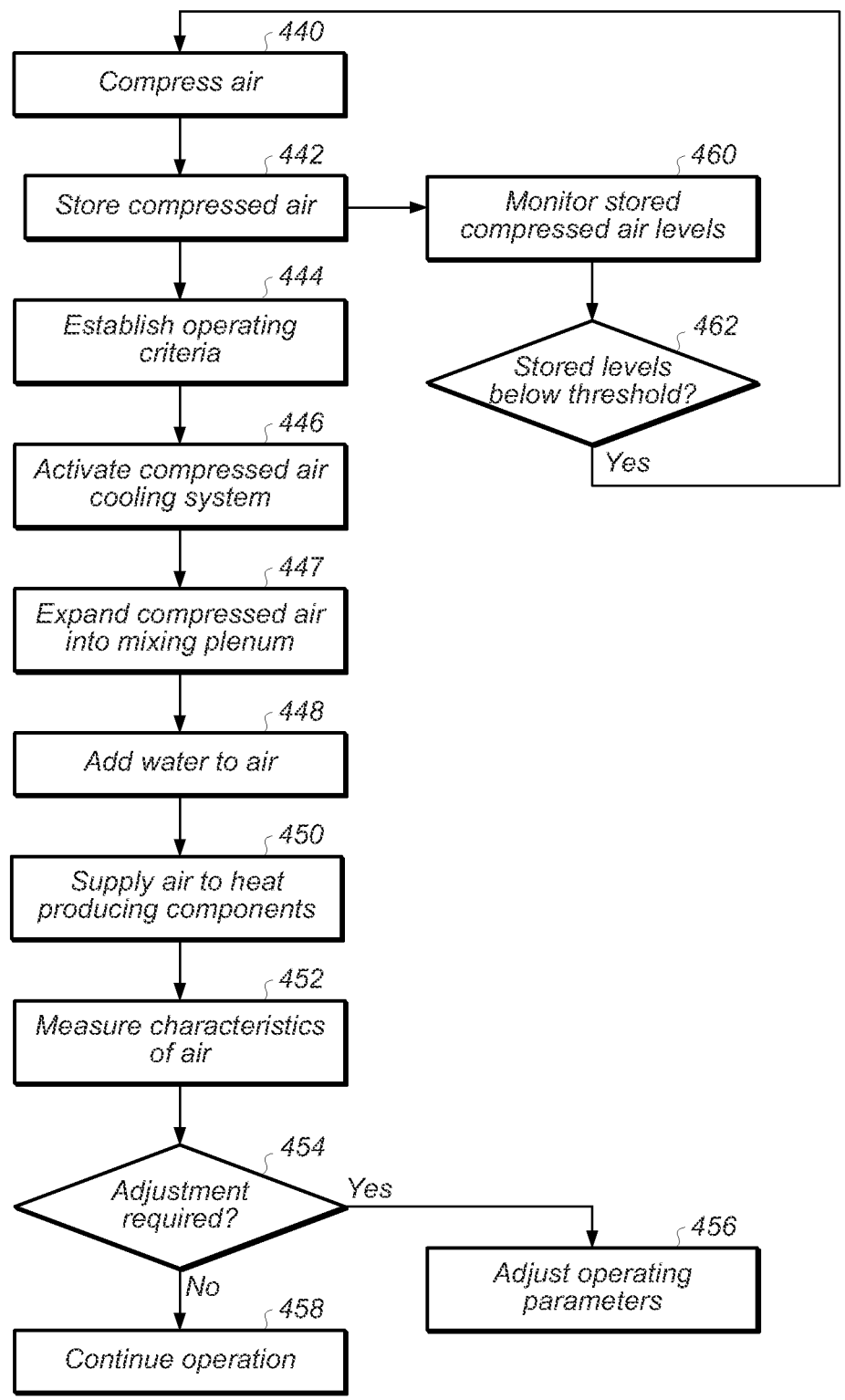
FIG. 7 illustrates one embodiment of cooling a data center using compressed air.

FIG. 7 illustrates one embodiment of cooling a data center using compressed air. At 440, air is compressed. In some embodiments, air may be compressed at the data center at which the air is to be used. In other embodiments, air may be compressed at a different location and transported to the data center.

At 442, the compressed air is stored. In some embodiments, air compression and accumulation in storage tanks may be carried out before cooling operations are commenced. In other embodiments, air compression may be carried out during cooling operations. In some embodiments, air compressors may continue to operate until the pressure and/or amount of air in the storage tanks reaches a predetermined level. When the pressure or amount of air has reached the predetermined level, the air compressors may be shut off.

At 444, operating criteria for rack-mounted computing systems in a data center are established. The operating criteria may include, for example, a target operating temperature range for servers in the rack system, an operating pressure, or a flow rate.

At 446, compressed air cooling system is activated. In one embodiment, compressed air from one or more storage tanks may be released into a compressed air storage chamber. In some embodiments, expansion of the air out of the storage tanks may reduce the temperature of the air. Air from the compressed air storage chamber may be expanded into a mixing plenum at 447. Air may further expand as it passes from the compressed air storage chamber into the mixing plenum, which may further reduce the temperature of the air. In some embodiments, the air from the compressed air chamber is mixed with other sources of air, such air outside air or air returned from a computer room. In certain embodiments, air from compressed air chamber is mixed with return air to raise or stabilize the temperature of the air.

At 448, water may be added to the air in the plenum. In some embodiments, adding water to the air may reduce a temperature of the air. In certain embodiments, water may be added with an evaporative cooling system, such as described above relative to FIG. 3.

At 450, air from the plenum is supplied to heat producing components in a data center. For example, the air may be supplied to rack-mounted computer systems through a subfloor, such as described above relative to FIG. 2.

At 452, one or more characteristics of air in the computer room are measured while the system operates. In some embodiments, the measured characteristics include an air temperature in a mixing plenum or a supply plenum. In other embodiments, the measured characteristics include an airflow rate of air flowing through the rack, or through a particular server in the rack. Other measured characteristics include temperature, pressure, or humidity of air in various locations.

At 454, a determination is made whether to adjust one or more operating parameters based on the measured characteristics and the operating criteria. If the measured characteristics of air and the operating criteria indicate that an adjustment is required, operating parameters are adjusted at 456. For example, if the flow rate through the servers is too low, a valve controlling flow from a storage chamber (such as compressed air storage chamber 184 describe above relative to FIG. 2) may be moved to a more open position to increase air from the compressed air storage chamber. If the measured characteristics of air and the operating criteria indicate that an adjustment is not required, operation is continued without adjusting the operating parameters at 458. Adjustments to operating parameters of a compressed air cooling system may be accomplished manually, automatically, or a combination thereof.

As another example, if outside air exceeds predetermined temperature and/or humidity limits, compressed air cooling may be activated or the flow of compressed air to a computer room increased. Conversely, if outside air is below predetermined temperature or humidity conditions, compressed air cooling may be deactivated or the flow of compressed air to a computer room decreased.

At 460, the pressure levels in compressed air storage tanks and/or the amount of compressed air in the storage tanks may be monitored. At 462, a determination may be made of whether pressure and/or amount of stored air have dropped below a predetermined threshold level. When the pressure and/or amount of air dropped below the predetermined level, compressors may be activated to recharge the storage tanks. Monitoring of compressed air storage tanks and recharging may be performed manually, automatically, or a combination thereof.

In certain embodiments, conditions for operating a compressed air subsystem may be timed-related. For example, if a data center has outdoor compressors whose noise levels exceed a location's night-time noise ordinances, the air compressors may be operated during the day and then shut off at night. As another example, if a data center has conventional air handling systems whose noise levels exceed a location's night-time noise ordinances, but also has a compressed air cooling system with compressors located inside a building, the conventional air handling systems may be shut down at night and the compressed air cooling system turned on. In this manner, a compressed air cooling system may allow a data center to have a higher duty cycle than a data center having only conventional cooling equipment.

In some embodiments, compressors may operate continuously during cooling of the data center. In other embodiments, compressors may be turned off during cooling operations, with any compressed air for cooling coming from accumulated air in compressed air storage tanks.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system for removing heat from components in a computer room of a data center, comprising:
   one or more air storage containers configured to hold compressed air;
   one or more air compressors configured to supply compressed air to at least one of the one or more air storage containers;
   one or more plenums in fluid communication with the at least one of the one or more air storage containers, wherein:
      each of the one or more plenums is a chamber configured to receive compressed air from the at least one of the one or more air storage containers, wherein compressed air received by the chamber of the plenum expands to at least partially decompress while inside the chamber before being discharged out of the chamber;
      at least one plenum of the one or more plenums is configured to discharge air out of the at least one plenum to supply the discharged air to the computer room in order to remove heat from the components; and
      each computer component from which heat is removed by the air in the at least one plenum is located outside the at least one plenum; and at least one compressed air storage chamber in fluid communication between the at least one plenum of the one or more plenums and the at least one of the one or more air storage containers.

2. The system of claim 1, wherein the at least one compressed air storage chamber is configured to:
   receive compressed air from the at least one of the one or more air storage containers, wherein compressed air received by the at least one compressed air storage chamber expands to partially decompress inside the at least one compressed air storage chamber; and
   supply the partially decompressed air to the at least one plenum.

3. The system of claim 1, further comprising one or more valves configured to control the flow of compressed air into the at least one plenum of the one or more plenums.

4. The system of claim 1, further comprising a control system coupled to one or more valves, wherein the control system is configured to control the flow of at least a portion of the air discharged out of the plenum.

5. The system of claim 1, further comprising one or more outside air vents configured to allow outside air to enter the at least one plenum of the one or more plenums, wherein the at least one plenum is configured to mix compressed air with at least a portion of the outside air.

6. The system of claim 1, wherein at least one of the one or more plenums comprises one or more return air vents configured to return air from the computer room, wherein the plenum is configured to mix compressed air with at least a portion of the air returned from the computer room.

7. The system of claim 1, further comprising at least one drying device configured to remove water from at least a portion of the compressed air.

8. The system of claim 1, further comprising at least one line configured to carry air from at least one of the plenums to at least one rack in the computer room.

9. The system of claim 1, further comprising at least one humidification device configured to introduce moisture into the air before the air enters the computer room.

10. The system of claim 1, further comprising at least one evaporative cooling system configured to cool the air before the air enters the computer room.

11. The system of claim 1, further comprising at least one filter configured to filter impurities from at least a portion of the compressed air before the compressed air enters the computer room.

12. A data center, comprising:
   a computer room;
   one or more computer systems in the computer room; and
   a cooling system configured to cool heat producing components in the computer systems, wherein the cooling system comprises:
      one or more air storage containers configured to hold compressed air;
      one or more air compressors configured to supply compressed air to at least one of the one or more air storage containers;
      one or more plenums in fluid communication with the at least one of the one or more air storage containers, wherein:
         each of the one or more plenums is a chamber configured to receive compressed air from the at least one of the one or more air storage containers, wherein compressed air received by the chamber of the plenum expands to at least partially decompress while inside the chamber before being discharged out of the chamber;
         at least one plenum of the one or more plenums is configured to discharge air out of the at least one plenum to supply the discharged air to the computer room in order to remove heat from the components; and
         each computer component from which heat is removed by the air in the at least one plenum is located outside the at least one plenum; and at least one compressed air storage chamber in fluid communication between the at least one plenum of the one or more plenums and the at least one of the one or more air storage containers.

13. The system of claim 12, wherein the at least one compressed air storage chamber is configured to:
receive compressed air from the at least one of the one or more air storage containers, wherein compressed air received by the at least one compressed air storage chamber expands to partially decompress inside the at least one compressed air storage chamber; and
supply the partially decompressed air to the at least one plenum.

14. The system of claim 12, wherein the computer room comprises one or more aisles, wherein the at least one plenum of the one or more plenums is configured to supply the air discharged out of the plenum to the one or more aisles in the computer room.

15. The system of claim 12, further comprising one or more racks, wherein the at least one of the computer systems is mounted in at least one of the racks.

16. The system of claim 12, further comprising one or more fans configured to pass air over at least one of the computer systems.

17. The system of claim 16, wherein at least one of the fans is located outside of the computer room.

18. The system of claim 16, further comprising one or more racks, wherein at least one of the fans is located in at least one of the racks.

19. The system of claim 12, wherein the cooling system comprises at least one pipe, wherein the at least one plenum is configured to discharge the air out of the plenum to supply the discharged air to at least one of the computer systems in the computer room through the at least one pipe.

20. The system of claim 12, further comprising:
one or more rack systems, wherein at least one of the computer systems is mounted in at least one of the racks of the one or more rack systems; and
one or more air directing devices, wherein at least one of the one or more air directing devices is configured to direct air into or out of at least one of the racks of the one or more rack systems.

21. The system of claim 12, further comprising at least one return air duct configured to return air to at least one of the plenums.

22. The system of claim 12, further comprising one or more outside air vents configured to allow outside air to enter the at least one plenum of the one or more plenums, wherein the at least one plenum is configured to mix compressed air with at least a portion of the outside air.

23. A method of cooling computer systems in computer room of a data center, comprising:
compressing air;
storing at least a portion of the compressed air in one or more air storage containers;
transferring compressed air stored in the one or more air storage containers to at least one compressed air storage chamber in fluid communication between the one or more air storage containers and a plenum, wherein the at least one compressed air storage chamber is configured to partially decompress the compressed air;
supplying the partially decompressed air to the plenum, wherein the plenum is a chamber, and wherein the partially decompressed air received by the chamber of the plenum expands to further decompress while inside the chamber before being discharged out of the chamber;
discharging air out of the plenum;
introducing at least a portion of the air discharged from the plenum into the computer room; and
flowing a portion of the air introduced into the computer room over at least one heat producing component of at least one of the computer systems in the computer room to cool the at least one heat producing component;
wherein each heat producing computer component cooled by the air in the plenum is located outside the plenum.

24. The method of claim 23, further comprising mixing a portion of the air in the plenum with outside air.

25. The method of claim 23, further comprising mixing a portion of the air in the plenum with air returned from the computer room.

26. The method of claim 23, further comprising exhausting at least a portion of air returned from the computer room to the outside.

27. The method of claim 23, further comprising humidifying the at least a portion of the air discharged from the plenum before introducing the at least a portion of the air discharged from the plenum into the computer room.

* * * * *